(12) United States Patent
Omura et al.

(10) Patent No.: US 7,232,763 B2
(45) Date of Patent: Jun. 19, 2007

(54) METHOD OF MANUFACTURING SEMICONDUCTOR DEVICE

(75) Inventors: Mitsuhiro Omura, Kawasaki (JP); Makiko Katano, Yokohama (JP); Shoko Ito, Yokohama (JP); Takaya Matsushita, Yokohama (JP); Hisashi Kaneko, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 10/959,501

(22) Filed: Oct. 7, 2004

(65) Prior Publication Data

US 2005/0106866 A1    May 19, 2005

(30) Foreign Application Priority Data

Oct. 8, 2003    (JP)    ............... 2003-349540

(51) Int. Cl.
H01L 21/311    (2006.01)
(52) U.S. Cl. ............... 438/700; 257/E21.256
(58) Field of Classification Search ............... 438/689, 438/700, 706, 710
See application file for complete search history.

(56) References Cited

U.S. PATENT DOCUMENTS

| | | | |
|---|---|---|---|
| 6,323,121 B1 | 11/2001 | Liu et al. | |
| 6,569,777 B1 * | 5/2003 | Hsu et al. | 438/725 |
| 6,677,247 B2 * | 1/2004 | Yuan et al. | 438/723 |
| 6,730,594 B2 * | 5/2004 | Noguchi et al. | 438/653 |
| 6,787,462 B2 | 9/2004 | Iijima et al. | |
| 2003/0181031 A1 | 9/2003 | Kojima et al. | |

FOREIGN PATENT DOCUMENTS

| | | |
|---|---|---|
| JP | 10-209272 | 8/1998 |
| JP | 2001-118846 | 4/2001 |
| JP | 2003-224185 | 8/2003 |

OTHER PUBLICATIONS

Notification of Reasons for Rejection issued by Japanese Patent Office on Jul. 26, 2005, in Japanese patent application No. 2003-349540.

* cited by examiner

*Primary Examiner*—Scott B. Geyer
(74) *Attorney, Agent, or Firm*—Finnegan, Henderson, Farabow, Garrett & Dunner, L.L.P.

(57) ABSTRACT

A method of manufacturing a semiconductor device includes subjecting a semiconductor wafer, which includes a copper layer formed above a semiconductor substrate and covered with an insulating film, to a dry etching using a fluorocarbon gas to partially remove the insulating film, thereby at least partially exposing a surface of the copper layer. The copper layer, the surface of which is at least partially exposed is subjected to a nitrogen plasma treatment. The semiconductor wafer having the nitrogen plasma-treated copper layer is exposed to atmosphere, and then the semiconductor wafer is subjected to a surface treatment.

18 Claims, 4 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2003-349540, filed Oct. 8, 2003.

BACKGROUND OF THE INVENTION

1. Field of the Invention

The present invention relates to a method of manufacturing a semiconductor device.

2. Description of the Related Art

In recent years, a damascene method has been used as a wiring technique for a semiconductor device in order to simplify the wiring process and to improve the yield and reliability of wiring. Further, copper has been used as a wiring material in order to reduce the resistance of the wiring.

For example, to form a multilayer copper wiring on a semiconductor substrate, a wiring groove is first formed in an interlayer insulating film formed on the semiconductor substrate. Then, the wiring groove is filled to form a copper wiring material layer. The copper wiring material layer is then planarized by chemical mechanical polishing (CMP) to form a first copper damascene wiring layer. Then, a barrier/etch stop insulating layer is deposited, covering the first copper damascene wiring layer. A second interlayer insulating film is then formed on the barrier/etch stop insulating film. Then, a photolithography technique, a dry etching technique, and an ashing technique are used to sequentially form a via hole which penetrates the second interlayer insulating film to expose the barrier/etch stop insulating film and a trench where a second copper damascene wiring layer is formed. The barrier/etch stop insulating film is removed by dry etching using a fluorocarbon gas, to expose a surface of the first copper damascene wiring layer. Subsequently, a copper wiring layer is deposited in the via hole and trench to form an interconnection plug and a second copper damascene wiring layer. Such a method of forming a copper damascene wiring layer is described in, for example, U.S. Pat. No. 6,323,121 B1.

After the barrier/etch stop insulating film has been removed by the dry etching using the fluorocarbon gas and before copper is deposited, a surface of a semiconductor wafer is often cleaned by, for example, a wet treatment. To conduct such a surface treatment, the semiconductor wafer is taken out of the dry etching apparatus after the dry etching has been finished, and transferred to a surface treatment step. Accordingly, when the semiconductor wafer is taken out of the dry etching apparatus, the exposed surface of the copper damascene wiring layer of the semiconductor wafer is exposed to the atmosphere.

As is well known in the art, copper metal is a material that is unlikely to form such a stable and dense oxide film on its surface, which may act as a protective film protecting the layer from corrosion. Thus, when the surface of the copper damascene wiring layer is exposed to the atmosphere, corrosion occurs, and the corrosion reaction is difficult to stop. Moreover, in the dry etching using the fluorocarbon etching gas, overetching is usually carried out, so that the copper damascene layer is exposed to the plasma of the fluorocarbon etching gas. As a result, fluorocarbon deposits are accumulated on the copper damascene wiring layer to attach fluorine to the copper surface. In the presence of a halogen such as fluorine which has a high electronegativity, the corrosion reaction (oxidation reaction) of the copper is expected to progress further rapidly due to reaction with moisture in the atmosphere.

The copper oxide resulting from the corrosion increases the volume of the copper damascene wiring layer, while reducing the metal copper in the copper damascene wiring layer. Consequently, when copper or tungsten is buried, defective burial or contact may result, causing the copper damascene wiring layer to be deformed. Further, when the copper oxide is subsequently removed by a cleaning treatment, a void may be created, which may remain as it is even after the burial of a buried wiring material, thus resulting in a defective contact. This may open the electric circuit or increase the resistance of the contact. These phenomena reduce the yield or reliability of the device.

There may be another cause of the contact of fluorine with the copper damascene wiring layer different from the fluorocarbon deposits on the surface of the copper damascene wiring layer. That is, when the barrier/etch stop insulating film on the copper damascene wiring layer is partially removed by the dry etching using the fluorocarbon gas, the fluorocarbon deposits adhere to the entire surface of the interlayer insulating film formed on the barrier/etch stop insulating film. When the interlayer insulating film is exposed to the atmosphere, fluorine is released from its surface. The fluorine may re-adhere to the copper damascene wiring layer to corrode the copper. Further, if the interlayer insulating film formed on the barrier/etch stop insulating film is formed of fluorine-containing silicon dioxide in particular, fluorine may also desorb from the film to further accelerate the corrosion.

BRIEF SUMMARY OF THE INVENTION

According to a first aspect of the present invention, there is provided a method of manufacturing a semiconductor device, comprising: subjecting a semiconductor wafer, which comprises a copper layer formed above a semiconductor substrate and covered with an insulating film, to a dry etching using a fluorocarbon gas to partially remove the insulating film, thereby at least partially exposing a surface of the copper layer; subjecting the copper layer, the surface of which is at least partially exposed, to a nitrogen plasma treatment; exposing the semiconductor wafer having the nitrogen plasma-treated copper layer to atmosphere, and subsequently subjecting the semiconductor wafer to a surface treatment.

According to a second aspect of the present invention, there is provided a method of manufacturing a semiconductor device, comprising: subjecting a semiconductor wafer, which comprises, above a semiconductor substrate, an electrically conductive layer covered with a first insulating film and a second insulating film formed on the first insulating film and having an opening which partially exposes a surface of the first insulating film, to a dry etching using a fluorocarbon gas to remove that portion of the first insulating film which is exposed at the opening, thereby at least partially exposing a surface of the conductive layer; subjecting a surface of the second insulating film to a nitrogen plasma treatment; exposing the semiconductor wafer having the second insulating film subjected to the nitrogen plasma treatment to atmosphere, and subsequently subjecting the semiconductor wafer to a surface treatment.

DETAILED DESCRIPTION OF THE INVENTION

In one aspect, the inventors have found that if dry etching using a fluorocarbon gas is conducted to partially remove an insulating film such as a barrier/etch stop insulating film which covers an electrically conductive layer such as a copper damascene wiring layer or an interconnection plug, to expose a surface of the conductive layer, a nitrogen plasma treatment conducted on the exposed surface of the conductive layer can suppress the corrosion of the conductive layer caused by fluorine from fluorocarbon-containing deposits accumulated on the conductive layer when the conductive layer is contacted with the atmosphere. Specifically, according to a first aspect of the present invention, before the semiconductor wafer is exposed to the atmosphere before receiving a surface treatment, the nitrogen plasma treatment is conducted on the conductive layer such as the copper damascene wiring layer or interconnection plug.

Usually, the partial removal of the barrier/etch stop insulating film is carried out using, as a mask, a second insulating film such as an interlayer insulating film which is formed on the barrier/etch stop insulating film and which has an opening (a via hole, an wiring groove (trench), or the like) partially exposing the barrier/etch stop insulating film. Then, in another aspect, the nitrogen-plasma treatment is also conducted on a surface of the second insulating film. However, the inventors have found that the nitrogen plasma treatment conducted on a surface of the second insulating film prevents the reattachment, to the surface of the conductive layer, of fluorine from the second insulating film exposed to the plasma from the fluorocarbon gas, thus suppressing the corrosion of the conductive layer which may occur when the conductive layer contacts with the atmosphere. Thus, according to a second aspect of the present invention, before the semiconductor wafer is exposed to the atmosphere before receiving a surface treatment, the surface of the second insulating film such as the interlayer insulating film is subjected to the nitrogen plasma treatment.

Embodiments of the present invention will be described below with reference to the drawings.

FIGS. 1A to 1D are schematic sectional views illustrating, in the order of steps, a method of manufacturing a semiconductor device having a dual damascene wiring layer according to an embodiment of the present invention.

Figure 1A:
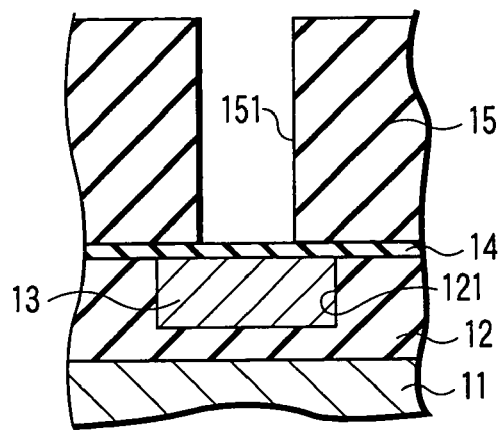
FIGS. 1A to 1D are schematic sectional views illustrating a method of manufacturing a semiconductor device having a dual damascene wiring layer according to an embodiment of the present invention.

As illustrated in FIG. 1A, a semiconductor wafer is prepared which comprises a copper damascene wiring layer 13 formed in a first interlayer insulating film 12 provided on a semiconductor substrate 11 such as a silicon substrate on which various semiconductor elements (not illustrated) are formed. The copper damascene wiring layer 13 can be formed in a trench (wiring groove) 121 in the first interlayer insulating film 12 by a conventional method of depositing a copper wiring material (using sputtering and/or a plating technique) and a conventional CMP technique. Usually, the copper damascene wiring layer 13 is electrically connected to the semiconductor element on the semiconductor substrate 11 through an interconnecting plug (not illustrated). Further, it is general practice that the copper wiring material is embedded in the trench 12 through a barrier metal material which prevents the copper diffusion (not illustrated), and the same applies to the steps described below.

A barrier/etch stop insulating film 14 is formed on surfaces of the first interlayer insulating film 12 and copper damascene wiring layer 13. In one embodiment, the barrier/etch stop insulating film 14 can be formed of, for example, silicon nitride. The barrier/etch stop insulating film 14 can have a thickness of, for example, 20 to 100 nm. A second interlayer insulating film 15 is formed on the barrier/etch stop insulating layer 14. In one embodiment, the second interlayer insulating film 15 can be formed from silicon dioxide, fluorine-containing silicon dioxide (FSG), a low-k material, or tetraethoxysilane (TEOS), or a stacked film thereof. The second interlayer insulating film 15 can have a thickness of, for example, 800 to 1,200 nm.

A via hole 151 is formed in the second interlayer insulating film 15 by using a conventional photolithography technique, dry etching technique, and ashing technique, so as to penetrate the second interlayer insulating film 15, partially exposing a surface of the barrier/etch stop film 14.

Figure 1B:
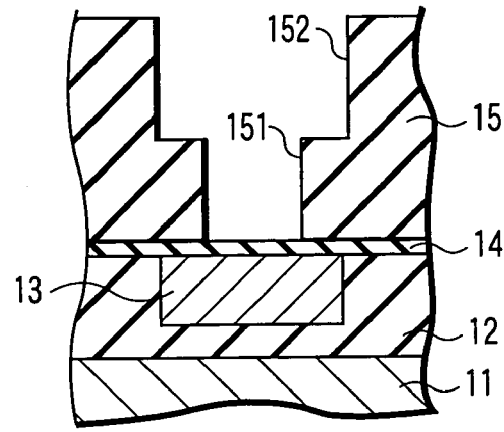

Subsequently, as illustrated in FIG. 1B, a trench (wiring groove) 152 is formed in an upper portion of the second interlayer insulating film 15 by a conventional photolithography technique, dry etching technique, and ashing technique. The trench 152 is formed such that it communicates with the via hole 151 and opens at a surface of the second interlayer insulating film 15. FIG. 1B illustrates one trench 152, but a plurality of trenches may be simultaneously formed.

Figure 1C:
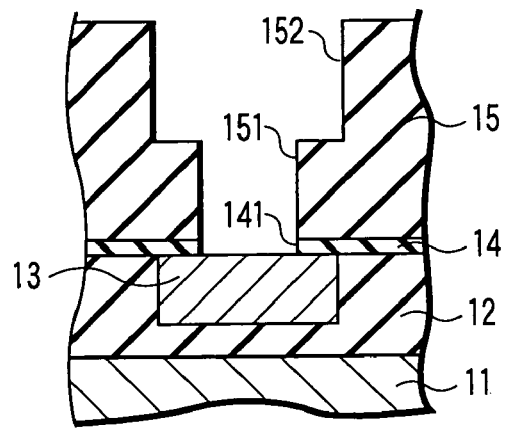

Then, as illustrated in FIG. 1C, an opening 141 is formed in the barrier/etch stop film 14 by a dry etching technique using a fluorocarbon gas such as $CF_4$, $CHF_3$, $CH_2F_2$ or $CH_3F$, partially exposing a surface of the copper damascene wiring layer 13.

Then, the exposed surface of the copper damascene wiring layer 13 is subjected to a nitrogen plasma treatment. In one embodiment, the nitrogen plasma treatment can be carried out by using a two-frequency superimposed parallel plate RIE apparatus to generate a nitrogen plasma from a nitrogen gas-containing plasma generating gas under conditions that a pressure is 4.0 to 6.5 Pa, a high frequency power is 400 to 600 W, a low frequency power is 80 to 120 W, and a nitrogen gas flow rate is 180 to 260 sccm. The plasma generating gas can consist of a nitrogen gas alone or a mixture of a nitrogen gas and a rare gas such as argon. The rare gas such as argon can be used at a flow rate of, for example, 40 to 60 sccm. A source of the nitrogen gas source and a source of the rare gas such as argon are usually connected to a dry etching apparatus, and thus do not add a new cost to the apparatus.

The nitrogen plasma treatment is carried out without exposing, to the atmosphere, the semiconductor wafer structure having the exposed copper damascene wiring layer 13 illustrated in FIG. 1C. To achieve this, the nitrogen plasma treatment can be carried out in the same chamber that is used to process the barrier/etch stop insulating film 14 (to form an opening 141), with the vacuum maintained therein. However, the semiconductor wafer structure having the exposed copper damascene wiring layer 13 illustrated in FIG. 1C can be transferred, without exposing the semiconductor wafer to the atmosphere, to a different chamber by vacuum transfer or transferring it while purging it with an inert gas such as a nitrogen gas to suppress moisture contamination, and the nitrogen plasma can be carried out in the different chamber. On the inner wall of the chamber used to process the barrier/etch stop insulating film 14 (to form an opening 141), various products including deposits of the fluorocarbon used for the processing adhere. When a nitrogen plasma is generated in this chamber, the plasma may attack the fluorocarbon deposits on, for example, the inner wall of the chamber, thereby depositing a relatively large amount of carbon on the copper damascene wiring layer 13. Thus, the adverse effect from the inner wall of the chamber during the plasma treatment of the copper surface may make the performance of plasma treatment of the copper surface unstable. Accordingly, the nitrogen plasma treatment is desirably conducted in a (clean) chamber different from the chamber used to process the barrier/etch stop insulating film 14 (to form an opening 141).

Such a nitrogen plasma treatment suppresses the corrosion of the copper damascene wiring layer even if the semiconductor wafer is exposed to the atmosphere afterward. Although the details of this mechanism are not clarified, it is expected that nitrogen reacts with the carbon in the fluorocarbon deposits adhering to the copper damascene wiring layer after overetching with the fluorocarbon gas, thus forming a very thin product having C—N bond, or the nitrogen and copper react with each other, thus forming a product having Cu—N bond, thereby blocking the corrosion reaction of the copper caused by fluorine and the moisture in the atmosphere. Further, as shown in Example 1, described later, the corrosion cannot be suppressed using a plasma treatment using an oxygen/argon mixed gas in place of the nitrogen plasma. Further, it is expected that if a plasma treatment using a hydrogen gas is carried out in place of the nitrogen plasma treatment, the fluorocarbon film on the copper surface may be removed to expose a pure copper, and a protective layer can not be formed on the copper surface. Thus, in this case, it is inferred that the corrosion in the atmosphere cannot be inhibited. Therefore, the nitrogen plasma generating gas is desirably free from an oxygen gas and/or a hydrogen gas. Further, when a plasma generating gas consisting of a nitrogen gas and a rare gas is used, the rare gas does not cause any chemical reaction but only sputters the surface of the copper damascene wiring layer. It is thus possible to control the amount of the Cu—N product and the C—N product expected to be formed.

The semiconductor wafer structure of FIG. 1C thus subjected to the nitrogen plasma treatment is taken out of the nitrogen plasma treatment apparatus into the atmosphere. The semiconductor wafer structure is then transferred to a surface treatment section (not illustrated), where a surface treatment is conducted. Usually, this surface treatment effects surface cleaning of the semiconductor wafer including the surface of the copper damascene wiring layer which has been subjected to the nitrogen plasma treatment, by, for example, wet etching using a wet agent such as diluted hydrofluoric acid, diluted sulfuric acid, phosphoric acid, hydrochloric acid or an aqueous choline (2-hydroxyethyltrimethylammonium hydroxide) solution.

Figure 1D:
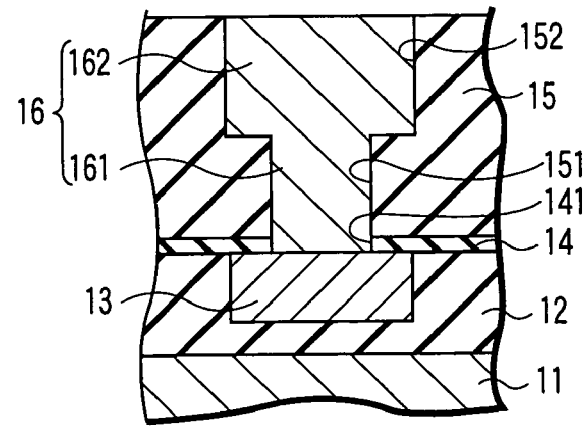

On the semiconductor wafer thus surface treated, deposition of copper wiring material using a conventional sputtering technique and/or plating technique and a conventional CMP are conducted to consecutively form a via plug (interconnection plug) 161 in the via hole 151 and a second damascene wiring layer 162 in the trench 152. The via plug 161 is formed such that it connects to the copper damascene wiring layer 13 through the opening 141 in the barrier/etch stop insulating film 14. Thus, a semiconductor device can be provided which has a copper dual damascene wiring layer 16 consisting of the via plug 161 and damascene wiring layer 162, which are integrated together (FIG. 1D).

FIGS. 2A to 2E are schematic sectional views illustrating, in the order of steps, a method of manufacturing a semiconductor device having a multilayered damascene wiring structure according to another embodiment of the present invention.

Figure 2A:
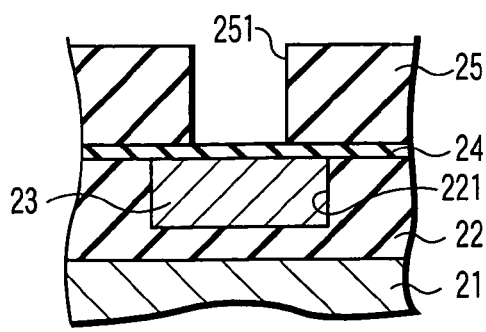
FIGS. 2A to 2E are schematic sectional views illustrating a method of manufacturing a semiconductor device having a damascene wiring layer according to another embodiment of the present invention.

As illustrated in FIG. 2A, a semiconductor wafer is prepared which comprises a copper damascene wiring layer 23 buried in a trench (wiring groove) 221 formed in a first interlayer insulating film 22, which is similar to the first interlayer insulating film 12 illustrated in FIG. 1A, provided on a semiconductor substrate 21 similar to the semiconductor substrate 11 illustrated in FIG. 1A. A barrier/etch stop insulating film 24, similar to the barrier etch stop insulating film 14 illustrated in FIG. 1A, is formed on the surfaces of the first interlayer insulating film 22 and copper damascene wiring layer 23. A second interlayer insulating film 25 is formed on the barrier/etch stop insulating film 24. The second interlayer insulating film 25 can be formed in the same manner as the second interlayer insulating film 15 illustrated in FIG. 1A. The second interlayer insulating film 25 can have a thickness of, for example, 400 to 600 nm. A via hole 251 which penetrates the second interlayer insulating film 25 to expose a surface of the barrier/etch stop insulating film 24 is formed in the second interlayer insulating film 25 in the same manner as the via hole 151 illustrated in FIG. 1A.

Figure 2B:
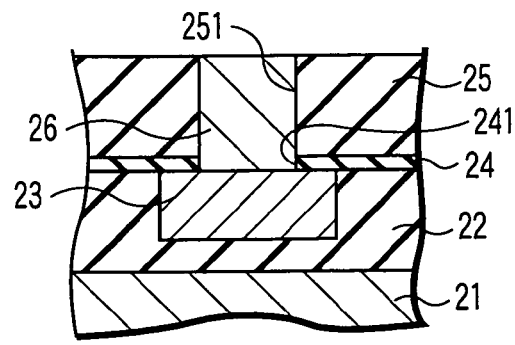

Then, an opening 241 is formed in the first barrier/etch stop insulating film 24 in the same manner as the opening 141 illustrated in FIG. 1C. If necessary, the copper damascene wiring layer 23 is subjected to a nitrogen plasma treatment, exposure to the atmosphere, and a surface cleaning treatment similar to those applied to the copper damascene wiring layer 13 illustrated in FIG. 1C. Subsequently, an electrically conductive plug material mainly containing copper is deposited by using a conventional sputtering technique and/or plating technique, and a via plug 26 is formed in the via hole 251 using the conventional CMP technique (FIG. 2B).

Figure 2C:
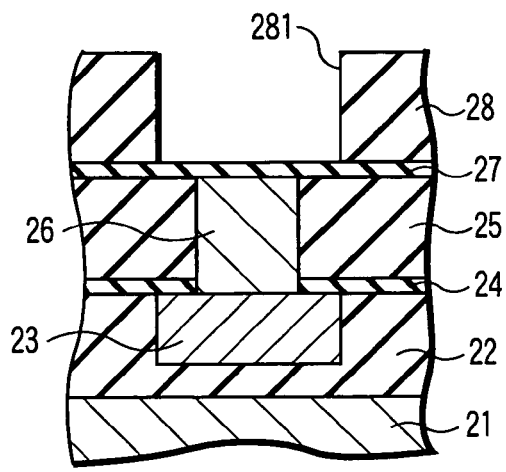

Next, a second barrier/etch stop insulating film 27 and a third interlayer insulating film 28 are sequentially deposited over the second interlayer insulating film 25 and the via plug 26. The barrier/etch stop insulating film 27 and the third interlayer insulating film 28 can be formed in the same manner as the first barrier/etch stop insulating film 24 and the second interlayer insulating film 25. The third interlayer insulating film 28 can have a thickness of, for example, 400 to 600 nm. Then, a trench (wiring groove) 281 partially exposing a surface of the second barrier/etch stop insulating film 27 is formed within the third interlayer insulating film 28 by using a photolithography technique, dry etching technique, and ashing technique (FIG. 2C). FIG. 2C illustrates only one trench 281 but a plurality of trenches may be simultaneously formed.

Figure 2D:
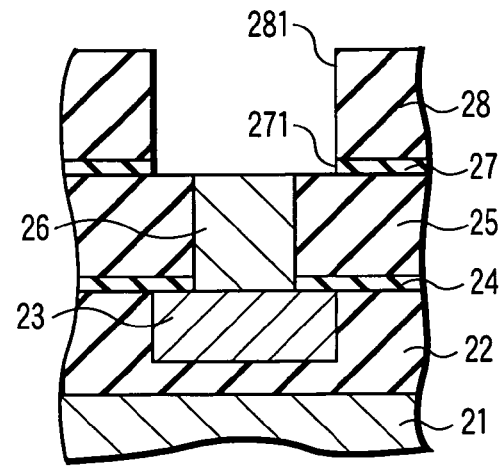

Subsequently, an opening 271 is formed in the second barrier/etch stop insulating film 27 by a dry etching technique using a gas such as $CF_4$ or $CHF_3$. The opening 271 is formed such that it exposes the entire surface of the via plug 26 and the surface of that portion of the second interlayer insulating film 25 which is located around the periphery of the via plug 26 (FIG. 2D).

Figure 2E:
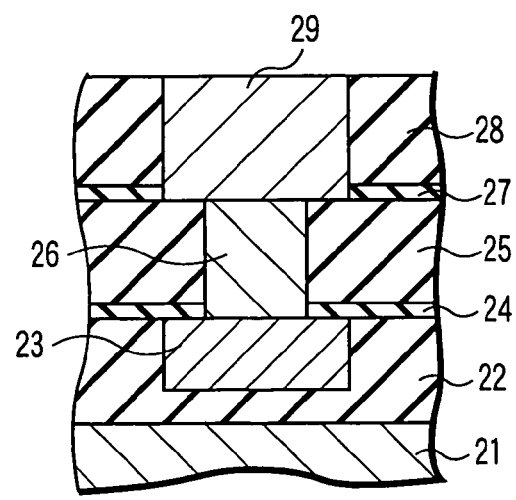

Then, after the nitrogen plasma treatment, exposure to the atmosphere, and surface cleaning treatment have been carried out as described above, a copper wiring material is formed over the surface of the third interlayer insulating film 28, filling the trench 281, by a sputtering technique and/or plating technique. Then, the copper wiring material layer is polished using a conventional CMP technique form a copper single damascene wiring layer 29. Thus, copper multilayered wiring is provided (FIG. 2E).

The nitrogen plasma treatment has been described with reference to FIGS. 1A to 1D and FIGS. 2A to 2E as being applied to the copper damascene wiring surface or the via plug surface. However, when the opening 141 or 271 is formed in the barrier/etch stop insulating film 14 or 27, respectively, by the dry etching using the fluorocarbon gas, there has been formed on the barrier/etch stop insulating film 14 or 27 the interlayer insulating film 15 or 28 having the opening (via hole 151 or trench 281) which partially exposes the barrier/etch stop insulating film 14 or 27. Accordingly, the exposed surface of the interlayer insulating film 15 or 28 including the inner surface of the via hole 151 or trench 281 is exposed to the dry etching atmosphere using the fluorocarbon gas and also undergoes the nitrogen plasma treatment.

When the barrier/etch stop insulating film 14 or 27 is partially removed by the dry etching using the fluorocarbon gas, the fluorocarbon deposits are accumulated all over the exposed surface of the interlayer insulating film 15 or 28. When this interlayer insulating film 15 or 28 is exposed to the atmosphere, fluorine is released from its surface, and may re-deposit on the copper damascene wiring layer, inducing corrosion of the copper. However, the exposed surface of the interlayer insulating film 15 or 28 is nitrided by the nitrogen plasma treatment conducted on the exposed surface of the interlayer insulating film 15 or 28. This significantly suppresses the release of the fluorine to further inhibit the corrosion of the copper. Moreover, when the interlayer insulating film 15 or 28 is formed of fluorine-containing silicon dioxide, even the desorption of fluorine from the film can be suppressed by conducting the nitrogen plasma treatment to nitride the surface of the interlayer insulating film 15 or 28. This is very effective in inhibiting the corrosion of the copper. By conducting the surface cleaning treatment using a diluted fluoric acid after the nitride plasma treatment, it is possible to remove the very thin nitride layer formed on the surface of the interlayer insulating film 15 or 28. This avoids affecting the inter-wiring capacitance.

EXAMPLE 1

In this Example, experiments were conducted to confirm that the corrosion of copper can be suppressed by nitrogen plasma treating a copper surface.

Wafers with the structure illustrated in FIG. 1B were prepared. The barrier/etch stop insulating film 14 was formed of silicon nitride and had a thickness of 70 nm. The second interlayer insulating film 15 was formed of fluorine-containing silicon dioxide and had a thickness of about 1,000 nm. The barrier/etch stop insulating film 14 was overetched and partially removed by dry etching using a $CF_4$ gas, partially exposing the copper damascene wiring layer 13. Then, a plasma treatment was conducted in the same chamber while changing a plasma generating gas as shown in Table 1. The wafer was then exposed to the atmosphere for several days. Then, the oxidation state of the surface of the copper damascene wiring layer 13 is observed with a scanning electron microscope to evaluate the amount of copper oxide formed (the level of corrosion). The results are shown in Table 1. Table 1 also shows an example in which no plasma treatment was conducted.

TABLE 1

| Plasma treatment | None | Oxygen/ argon mixed gas | Nitrogen gas | Nitrogen/ argon mixed gas |
| --- | --- | --- | --- | --- |
| Amount of copper oxide formed | Large | Large | Small | small |

The results shown in Table 1 indicate that the copper is markedly corroded when the barrier/etch stop insulating film 14 is removed the dry etching using a $CF_4$ gas to expose the copper damascene wiring layer and then the damascene wiring layer is left to stand in the atmosphere without conducting any plasma treatment on it. Further, the results also indicate that the corrosion of the copper is not suppressed even by conducting a plasma treatment with an oxygen/argon mixed gas on the copper damascene wiring layer exposed by dry etching and then exposing the treated copper damascene wiring layer to the atmosphere. In contrast, the results indicate that the corrosion of the copper is suppressed by the exposure to the atmosphere when a plasma treatment with nitrogen or a nitrogen/argon mixed gas is conducted on the copper damascene wiring layer exposed by dry etching.

Figure 3:
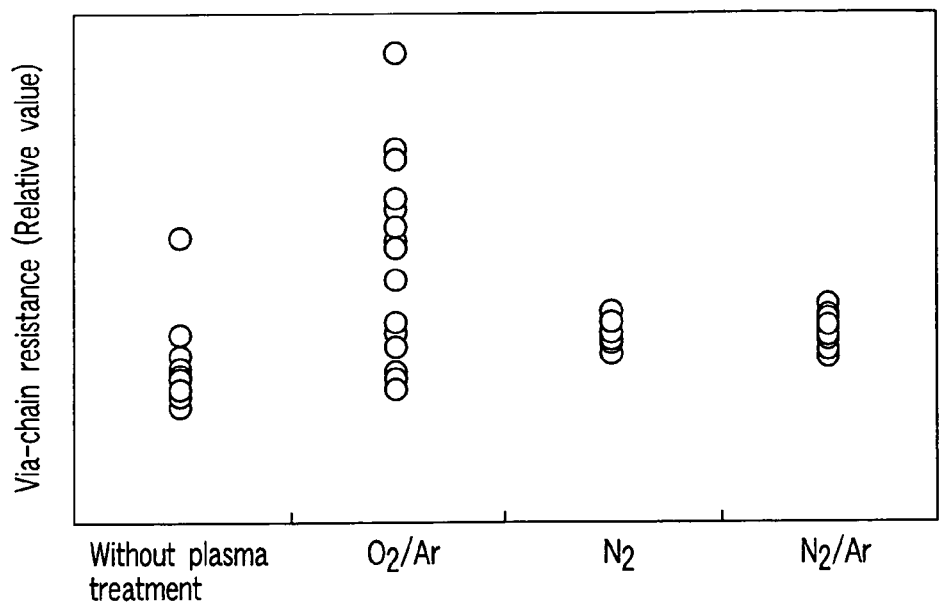
FIG. 3 is a graph showing a variation in via-chain resistance which occurs when a copper damascene wiring layer is formed through a treatment with plasma from various plasma generating gases after dry etching with a fluorocarbon gas, together with a variation in via-chain resistance which occurs when the plasma treatment is not conducted after the dry etching with a fluorocarbon gas.

Further, for the semiconductor wafers on which a plasma treatment was conducted using the different plasma generating gases or on which no plasma treatment was conducted, a copper damascene wiring layer was formed and a variation in the resistance of a via-chain was measured. The results are shown in FIG. 3. The results show that the resistance value of the via-chain varied significantly in the wafers on which no plasma treatment was conducted and on which the plasma treatment with the oxygen/argon ($O_2/Ar$) mixed gas was conducted, whereas the resistance value of the via chain varied little in the wafers on which the plasma treatment with a nitrogen ($N_2$) gas or the nitrogen/argon ($N_2/Ar$) mixed gas was conducted. The results of the evaluation with the scanning electron microscope clearly indicate that the difference in variation in resistance is caused by the corrosion of copper in the atmosphere.

EXAMPLE 2

Figure 4:
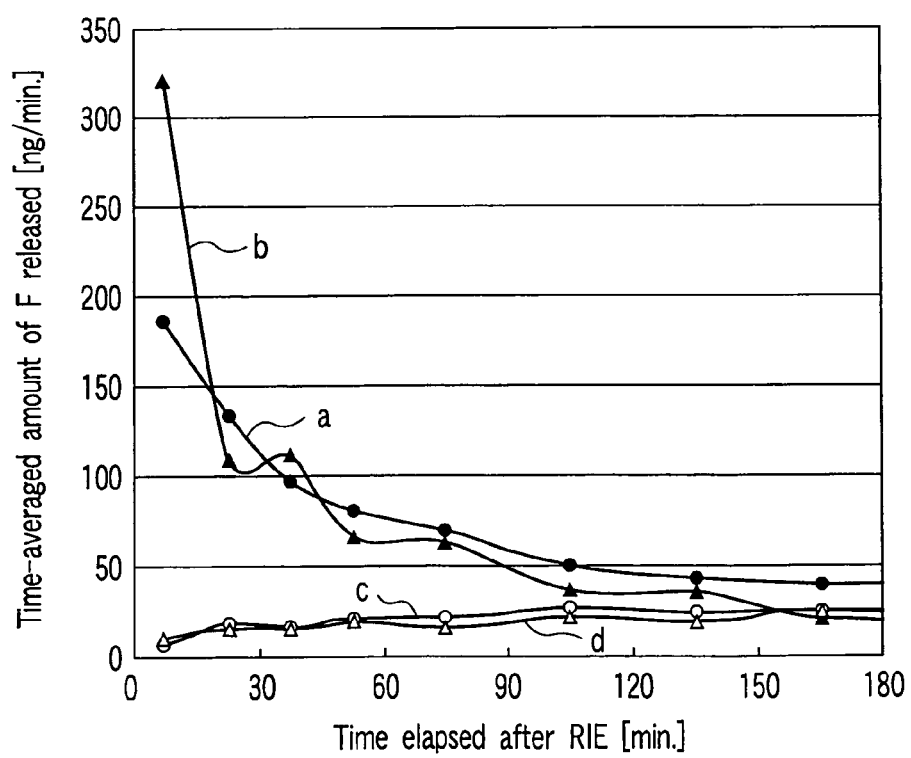
FIG. 4 is a graph showing the amounts of fluorine released when a nitrogen plasma treatment is conducted on various silicon oxide insulating films after the dry etching with a fluorocarbon gas and when the nitrogen plasma treatment is not conducted after the dry etching with a fluorocarbon gas.

As experimental samples, a fluorine-containing silicon dioxide (hereinafter referred to as "FSG") film and a silicon dioxide not containing fluorine (hereinafter referred to as "SiO$_2$") film were formed on the respective silicon substrates to a thickness of about 500 to 1,000 nm. The surfaces of these silicon oxide films were subjected to a dry etching treatment using a CF$_4$ gas. These films were not exposed to the atmosphere after the dry etching. Then, one of the FSG films and one of the SiO$_2$ films were subjected to a nitrogen plasma treatment. On the other hand, the other FSG film and the other SiO$_2$ film were not subjected to the nitrogen plasma. Thereafter, all the films were exposed to the atmosphere and the amount of fluorine released from the surface of the silicon oxide film was measured. The results are shown in FIG. 4. In FIG. 4, a line a indicates the results for the FSG without nitrogen plasma treatment. A line b indicates the results for the SiO$_2$ without nitrogen plasma treatment. A line c indicates the results for the FSG treated with the nitrogen plasma. A line d indicates the results for the SiO$_2$ treated the nitrogen plasma.

FIG. 4 clearly shows that for both FSG and SiO$_2$, a large amount of fluorine is released during exposure to the atmosphere when the nitrogen plasma treatment is not conducted on the film. A particularly large amount of fluorine is released during the initial period of exposure to the atmosphere (lines a and b). For the SiO$_2$, it is considered that the fluorine attached to the film by the dry etching using the fluorocarbon gas is released. For the FSG, the fluorine originally contained in the FSG may also be released. In contrast, the results for the case in which the nitrogen plasma treatment was conducted indicate that the release of fluorine is almost perfectly suppressed (lines c and d). Clearly, the nitrogen plasma treatment enables the inhibition of the release, to the atmosphere, of the fluorine attached to the silicon oxide film by the dry etching using the fluorocarbon gas and of the fluorine contained in the silicon oxide film.

Figure 5:
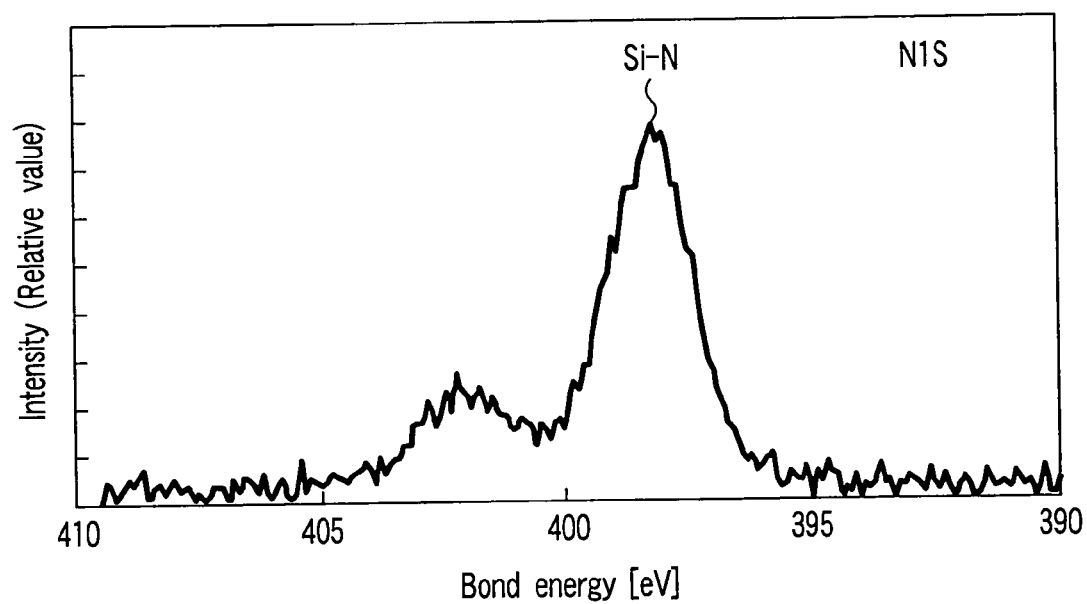
FIG. 5 is an Ns1 spectrum of a surface of a fluorine-containing silicon dioxide film subjected to the nitrogen plasma treatment after the dry etching with a fluorocarbon gas.

Moreover, FIG. 5 shows the results of analysis of the surface of the FSG treated with the nitrogen plasma after the dry etching using the fluorocarbon gas. The analysis was conducted using an X-ray photoelectron spectroscopy (XPS) method. As seen in FIG. 5, the presence of the Si—N bond is conformed in the N1s spectrum, indicating that the surface of the silicon oxide is nitrided. Therefore, the inhibition of the release of fluorine is considered to result from this nitrided layer on the surface.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    subjecting a semiconductor wafer, which comprises a copper layer formed above a semiconductor substrate and covered with an insulating film, to a dry etching using a fluorocarbon gas to partially remove the insulating film, thereby at least partially exposing a surface of the copper layer;
    subjecting the copper layer, the surface of which is at least partially exposed, to a nitrogen plasma treatment wherein the nitrogen plasma is generated from a hydrogen gas-free, nitrogen gas-containing plasma generating gas;
    exposing the semiconductor wafer having the nitrogen plasma-treated copper layer to atmosphere; and
    subsequently subjecting the semiconductor wafer to a surface treatment,
    wherein said subjecting the semiconductor wafer to the dry etching is immediately followed by said subjecting the copper layer to the nitrogen plasma treatment.

2. The method according to claim 1, wherein the plasma generating gas consists of a nitrogen gas alone or a mixture of a nitrogen gas and a rare gas.

3. The method according to claim 1, wherein the dry etching and the nitrogen plasma treatment are carried out in a same chamber.

4. The method according to claim 1, wherein the dry etching is carried out in a first chamber, then the semiconductor wafer is transferred to a second chamber different from the first chamber, without exposing the semiconductor wafer to atmosphere, and the nitrogen plasma treatment is carried out in the second chamber.

5. The method according to claim 1, wherein the fluorocarbon gas comprises CF4, CHF3, CH2F2 or CH3F.

6. The method according to claim 1, wherein the surface treatment is a wet treatment.

7. The method according to claim 1, wherein the surface treatment is a surface cleaning treatment using diluted hydrofluoric acid, diluted sulfuric acid, phosphoric acid, hydrochloric acid or aqueous choline solution.

8. The method according to claim 1, wherein the plasma generating gas is substantially free of oxygen.

9. A method of manufacturing a semiconductor device, comprising:
    subjecting a semiconductor wafer, which comprises, above a semiconductor substrate, an electrically conductive layer covered with a first insulating film and a second insulating film formed on the first insulating film and having an opening which partially exposes a surface of the first insulating film, to a dry etching using a fluorocarbon gas to remove that portion of the first insulating film which is exposed at the opening, thereby at least partially exposing a surface of the conductive layer;
    subjecting a surface of the second insulating film to a nitrogen plasma treatment wherein the nitrogen plasma is generated from a hydrogen gas-free, nitrogen gas-containing plasma generating gas;
    exposing the semiconductor wafer having the second insulating film subjected to the nitrogen plasma treatment to atmosphere; and
    subsequently subjecting the semiconductor wafer to a surface treatment,
    wherein said subjecting the semiconductor wafer to the dry etching is immediately followed by said subjecting the surface of the second insulating film to the nitrogen plasma treatment.

10. The method according to claim 9, wherein the conductive layer comprises copper.

11. The method according to claim 9, wherein the surface of the second insulating film is nitrided by the nitrogen plasma treatment.

12. The method according to claim 9, wherein the second insulating film comprises a fluorine-containing silicon oxide film.

13. The method according to claim 9, wherein the plasma generating gas consists of a nitrogen gas alone or a mixture of a nitrogen gas and a rare gas.

14. The method according to claim 9, wherein the dry etching and the nitrogen plasma treatment are carried out in a same chamber.

15. The method according to claim 9, wherein the dry etching is carried out in a first chamber, then the semiconductor wafer is transferred to a second chamber different from the first chamber, without exposing the semiconductor wafer to atmosphere, and the nitrogen plasma treatment is carried out in the second chamber.

16. The method according to claim 9, wherein the fluorocarbon gas comprises CF4, CHF3, CH2F2 or CH3F.

17. The method according to claim 9, wherein the surface treatment is a wet treatment.

18. The method according to claim 9, wherein the plasma generating gas is substantially free of oxygen.

* * * * *